US012772893B2

(12) United States Patent
Savino et al.

(10) Patent No.: US 12,772,893 B2
(45) Date of Patent: Oct. 20, 2026

(54) POWER MODULE HAVING LEADFRAME-LESS SIGNAL CONNECTORS, IN PARTICULAR FOR AUTOMOTIVE APPLICATIONS, AND ASSEMBLING METHOD THEREOF

(71) Applicant: STMICROELECTRONICS S.r.l., Agrate Brianza (IT)

(72) Inventors: Sergio Savino, Catania (IT); Francesco Salamone, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 596 days.

(21) Appl. No.: 18/193,095

(22) Filed: Mar. 30, 2023

(65) Prior Publication Data

US 2023/0317537 A1 Oct. 5, 2023

(30) Foreign Application Priority Data

Apr. 4, 2022 (IT) ........................ 102022000006617

(51) Int. Cl.
*H10W 74/00* (2026.01)
*H02M 1/00* (2007.01)
(Continued)

(52) U.S. Cl.
CPC ........ *H10W 74/114* (2026.01); *H10W 70/657* (2026.01); *H10W 72/30* (2026.01); (Continued)

(58) Field of Classification Search
CPC . H01L 23/3121; H01L 23/057; H01L 23/315; H01L 23/49805; H01L 24/29; H01L 2924/1425; H01L 2924/1811; H01L 23/49811; H05K 5/0217; H05K 7/14329; H02M 1/00; H10W 74/114; H10W 70/657; H10W 72/30; H10W 74/124;
(Continued)

(56) References Cited

U.S. PATENT DOCUMENTS

| | | | |
|---|---|---|---|
| 7,227,259 | B2 | 6/2007 | Heilbronner et al. |
| 7,751,207 | B2 | 7/2010 | Schreiber et al. |

(Continued)

FOREIGN PATENT DOCUMENTS

| | | | |
|---|---|---|---|
| CN | 104576559 | A | 4/2015 |
| CN | 113540008 | A | 10/2021 |

(Continued)

*Primary Examiner* — Zandra V Smith
*Assistant Examiner* — Daniel J Hibbert
(74) *Attorney, Agent, or Firm* — Seed IP Law Group LLP

(57) ABSTRACT

Power module packaged in a housing accommodating a carrying substrate forming a plurality of connection regions of conductive material. An electronic component is arranged inside the housing, attached to a connection region of the plurality of connection regions. An electrical connector, coupled to the electronic component, extends towards the main surface of the housing and is accessible from the outside of the housing. The electrical connector has a tubular portion forming a pillar fixed to a pin which protrudes from the greater surface of the housing. The housing includes a packaging mass of electrically insulating material that embeds the pillar and blocks it therein.

21 Claims, 10 Drawing Sheets

(51) Int. Cl.
*H10W 70/65* (2026.01)
*H10W 72/30* (2026.01)
*H10W 74/10* (2026.01)
*H10W 76/157* (2026.01)
*H05K 5/02* (2006.01)

(52) U.S. Cl.
CPC ....... *H10W 74/124* (2026.01); *H10W 76/157* (2026.01); *H05K 5/0217* (2013.01); *H10W 74/00* (2026.01)

(58) Field of Classification Search
CPC . H10W 76/157; H10W 74/00; H10W 70/658; H10W 90/701
See application file for complete search history.

(56) References Cited

U.S. PATENT DOCUMENTS

| | | | | |
|---|---|---|---|---|
| 9,591,755 | B2 | 3/2017 | Spang et al. | |
| 11,864,361 | B2 | 1/2024 | Stella et al. | |
| 2002/0018353 | A1 | 2/2002 | Mourick | |
| 2009/0213553 | A1* | 8/2009 | Tschirbs | H10W 40/255 361/728 |
| 2010/0013086 | A1* | 1/2010 | Obiraki | H10W 40/255 257/E23.116 |
| 2012/0327609 | A1 | 12/2012 | Kitamoto | |
| 2014/0218871 | A1 | 8/2014 | Kim et al. | |
| 2015/0103498 | A1 | 4/2015 | Lee et al. | |
| 2016/0247735 | A1* | 8/2016 | Lin | H10W 76/15 |
| 2017/0092596 | A1 | 3/2017 | Yoshihara | |
| 2019/0296014 | A1 | 9/2019 | Kahrimanovic | |
| 2020/0027807 | A1 | 1/2020 | Cheng et al. | |
| 2021/0037674 | A1 | 2/2021 | Stella et al. | |
| 2023/0420341 | A1 | 12/2023 | Savino | |
| 2024/0014193 | A1 | 1/2024 | Sakai et al. | |

FOREIGN PATENT DOCUMENTS

| | | | | |
|---|---|---|---|---|
| DE | 102009032973 | A1 | 1/2010 | |
| DE | 102014211698 | A1 * | 12/2015 | H01R 4/024 |
| EP | 0845801 | A1 | 6/1998 | |
| EP | 1121009 | A2 * | 8/2001 | H02M 7/003 |
| JP | 2012004226 | A * | 1/2012 | H01L 24/32 |
| WO | WO 2022118633 | A1 | 6/2022 | |

* cited by examiner

FIG. 1
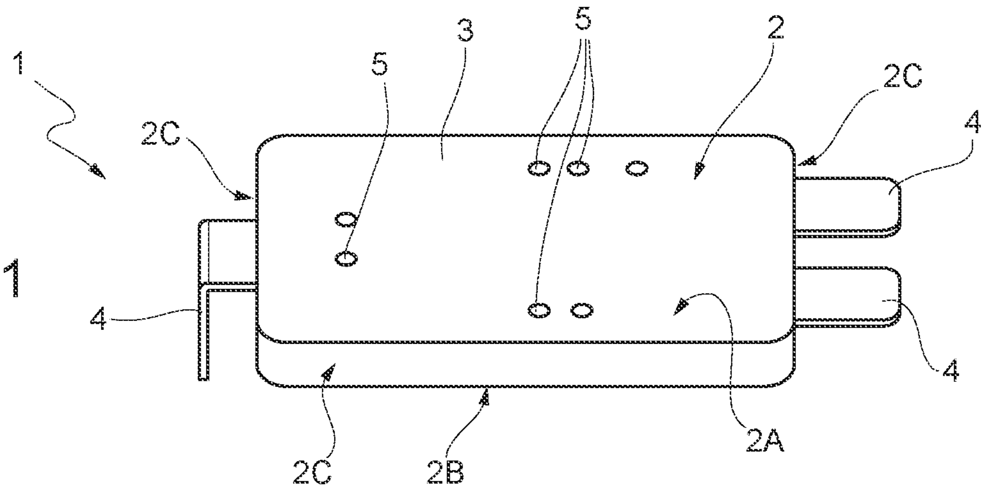
FIG. 2
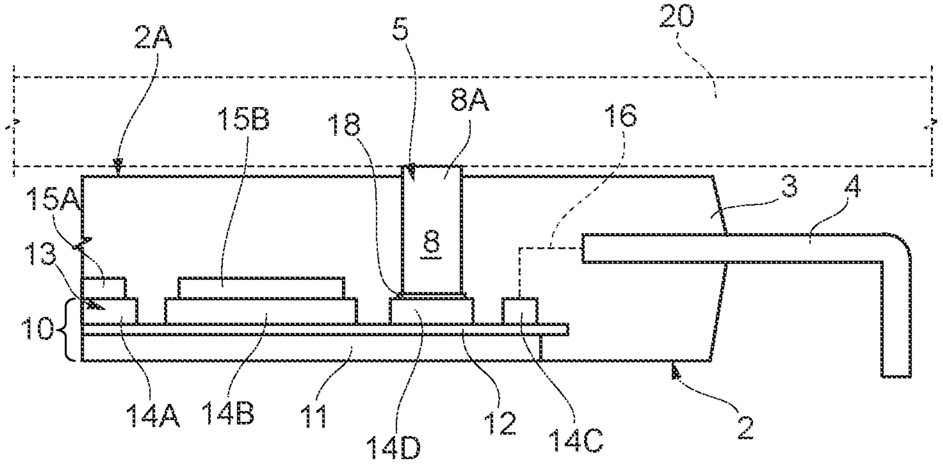
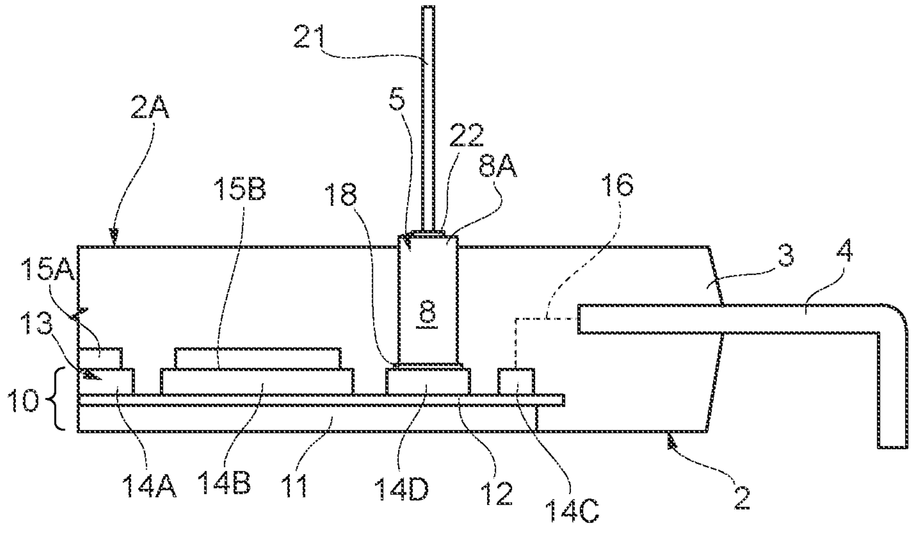
FIG. 3

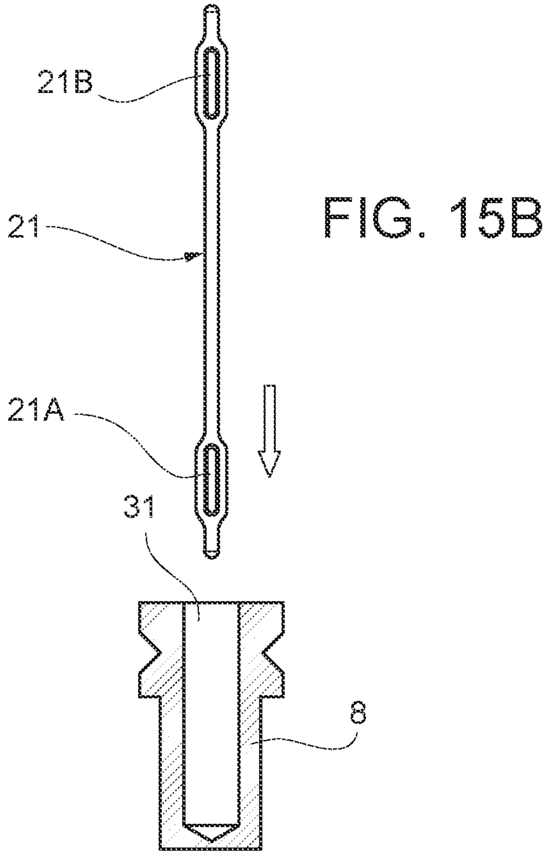
FIG. 15B
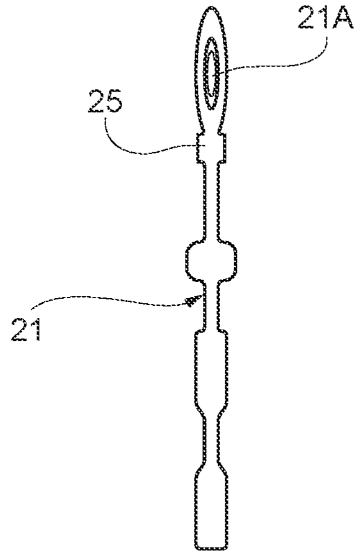
FIG. 15C
FIG. 18
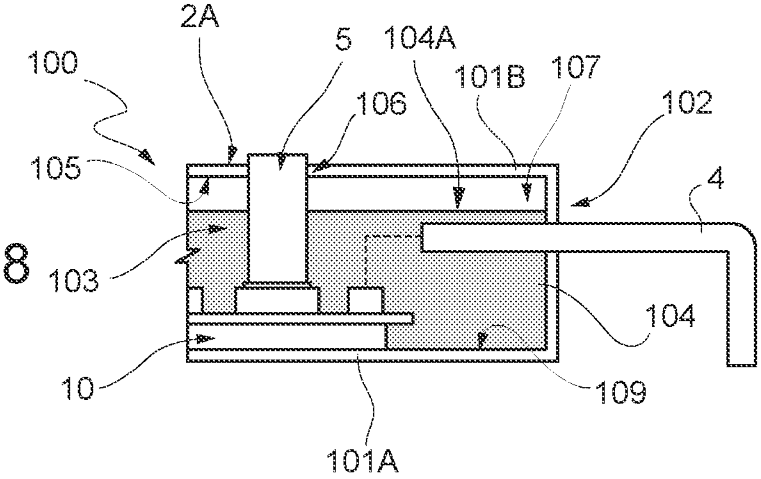

POWER MODULE HAVING LEADFRAME-LESS SIGNAL CONNECTORS, IN PARTICULAR FOR AUTOMOTIVE APPLICATIONS, AND ASSEMBLING METHOD THEREOF

BACKGROUND

Technical Field

The present disclosure relates to a power module having leadframe-less signal connectors, in particular for automotive applications, and to the assembling method thereof.

Description of the Related Art

As known, electric and hybrid propulsion vehicles comprise control electronics of the electric motor. In particular, the control electronics associated with vehicles of this type comprises power modules which may include both power components and signal processing components.

For example, the control electronics associated with electric propulsion generally comprises power phase inverters (so-called inverters) and rectifiers capable of operating at even very high voltages, up to 1200 V.

To electrically couple the modules to each other and to the loads (electric motor and/or vehicle members), the control electronics further generally comprises suitable connection structures, including leads and connection pins of greater dimensions with respect to the signal conduction pins or electronic circuits used in other fields.

The modules are normally enclosed in a packaging body of insulating material, for example molded, or produced using a gel potted technique, wherein a plastic box is filled with an insulating gel and encloses the components, with protruding pins. In both cases, the package has a generally parallelepipedal shape, with two greater surfaces (upper and lower), and four lateral surfaces, of smaller area, with the electrical connection pins protruding therefrom.

The molded power modules are generally arranged on a shaped metal support, called a leadframe, which also forms the pins for both the power connection and the signal connection.

This involves a considerable layout complexity to avoid the presence of parasitic components, typically parasitic inductances, as well as requiring an accurate design to ensure the safety isolation distances ("clearance and creepage") and not allowing an efficient use of available spaces.

Furthermore, the overall dimensions of the power module cannot be reduced as desired, due to the need to maintain safety distances.

Furthermore, it is not easy to modify the type of external pins or leads and the way they are connected to the external connection elements (for example to share existing solutions between press-fit connections, soldering, screwing, etc.), depending on the specific design.

BRIEF SUMMARY

The present provides at least one embodiment of a power module which overcomes the drawbacks of the prior art and provides at least one embodiment of an assembling method.

In practice, the power module houses a pillar, typically coupled to the substrate carrying the electronic components of the power module and facing one of the greater surfaces (typically, the upper surface) of the package. Alternatively, it may be attached directly to a component of the power module.

The pillar may be attached to the substrate by soldering, with or without filler material (soldering, welding and sintering), or with a conductive glue.

The pillar shape and the package are designed so as to compensate for any manufacturing dimensional variations as well as errors and inaccuracies in mutual positioning between the pillar attaching zone in the power module, the pillar and the pin or other external connection structure, due to process tolerances.

The pillar has an external connection end variable according to the type of connection: for example, the connection end may be flat, for surface mounting or for coupling to external pins by press-fit or soldering; the pillar may be formed in an integral manner with the external pin; the connection end may have a recess configured to allow connection with the external pin by press-fit or by screwing (presence of a thread); the pillar may have structures that prevents its extraction (undercuts, knurls, surface irregularities with protrusions or recesses); and the pillar may have any shape and section, for example it may have a cylindrical shape with a circular section.

The pillar is embedded in the housing so that its lateral sides are completely or almost completely surrounded by and in contact with a packaging mass that blocks and extends around the pillar.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIG. 1 is a top perspective view of an embodiment of the present power module;

FIG. 2 is a cross-section of a part of the power module of FIG. 1, for a surface mounting connection;

FIG. 3 is a cross-section similar to FIG. 1, after soldering a pin;

FIG. 15B shows a different coupling between the present power module and external pins by the pin holders;

FIG. 15C shows a different embodiment of a pin coupleable to the present power module;

FIG. 18 is a cross-section of a part of the present power module, for a housing formed using the gel-potted technique;

DETAILED DESCRIPTION

Figure 4:
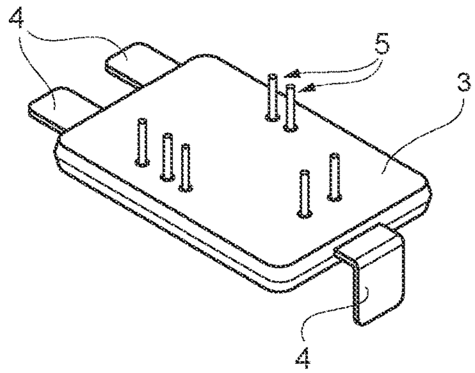
FIG. 4 is a top perspective view of an embodiment of the present power module.

The following description refers to the arrangement shown; consequently, expressions such as “above”, “below”, “upper”, “lower”, “right”, “left” relate to the attached figures and are not to be interpreted in a limiting manner.

FIG. 1 shows a power module 1 packaged in a housing 2 formed by a packaging mass 3, of insulating material, here molded resin (e.g., a molding compound, an encapsulant, an epoxy, or some other suitable insulating material).

The housing 2 has a generally parallelepipedal shape, with an upper surface 2A, a lower surface 2B and lateral surfaces 2C.

The housing 2 houses a substrate 10, carrying electronic components (here, two shown, indicated as first and second electronic components 15A, 15B).

Signal or power leads 4 protrude from lateral surfaces 2C of the housing 2, here two lateral surfaces 2C opposite to each other.

Connectors 5, generally signal but, if desired, also power connectors, extend through the housing 2, between the substrate 10 and the upper surface 2A. The connectors 5 may be arranged level, slightly protruding from the upper surface 2A or even slightly recessed with respect thereto.

In the embodiment of FIG. 2, the power connectors 5 (only one visible) are formed by pillars 8 attached to a substrate 10.

In detail, in FIG. 2 the substrate 10 is formed by a multilayer, for example a DBC (Direct Bonded Copper) substrate or an AMB (Active Metal Brazing) substrate, and comprises a first conductive layer 11, typically of metal such as copper; an intermediate layer 12, insulating, for example of ceramic, arranged on the first conductive layer 11; and a second conductive layer 13, typically of metal such as copper, arranged on the intermediate layer 12.

The second conductive layer 13 is shaped so as to define a plurality of connection islands or regions 14.

A first, a second, a third and a fourth connection region 14A-14D are for example visible in FIG. 2.

Here, the first and the second electronic components 15A, 15B, for example power components such as diodes, transistors, thyristors or IGBTs, or packaged discrete components are attached and electrically coupled to the first and, respectively, to the second connection regions 14A, 14B.

The third connection region 14C is coupled to one of the leads 4, in a not visible manner and ideally represented by a dashed line 16. In turn, the third connection region 14C is connected in a manner not shown (for example, through wires or through tracks formed in the second conductive layer 13) to one or both the electronic components 15A, 15B. However, the leads 4 may also be connected directly to the electronic components 15A, 15B.

The fourth connection region 14D carries and is electrically coupled to one of the pillars 8. In particular, the pillar 8 of FIG. 2 may be soldered or glued to the fourth connection region 14D through bonding material 18, for example using a filler material or a conductive glue or adhesive.

The pillar 8 is embedded in the housing 2 so that its lateral sides are almost completely surrounded by and in contact with the packaging mass 3 that blocks and extends around the pillar 8 in the housing 2.

As visible from FIG. 2, the fourth connection region 14D is flat and the pillar 8 is bonded to the fourth connection region in a planar way, thus simplifying manufacture of the power module.

The pillar 8 here has a cylindrical shape with a circular base and extends from the fourth connection region 14D up to the upper surface 4A of the housing 2, perpendicular to the substrate 10.

In the embodiment of FIG. 2, the pillar 8 protrudes slightly from the upper surface 4A with an end 8A.

The pillar 8 has dimensions generally linked to the dimensions of the power module 1. For example, it may have a height comprised between 2 and 7 mm (millimeters), in particular of about 4.5 mm, and a diameter comprised between 1 and 5 mm, for example of about 2 mm.

In the embodiment of FIGS. 1 and 2, the end 8A of the pillar 8 is flat and may be used for coupling to user boards, as represented with a dashed line in FIG. 2 (board 20).

Alternatively, a pin 21 may be attached to the pillar 8, as shown in FIG. 3.

In particular, here, “pin” 21 is intended as a rod-shaped element that allows a current to flow and has a height higher than or equal to that of the pillar 8.

For example, the pins 21 are of metal. They may have a height generally comprised between 2.8 and 14 mm, for example of 8 mm, and a circular section, in particular with a diameter comprised between 0.5 and 1.5 mm, for example of 0.8 mm.

Furthermore, in FIG. 3 the pin 21 has a base 22, wider than the rod-shaped portion, attached to the end 8A of the pillar 8. For example, the base 22 may have a thickness comprised between 0.2 and 0.4 mm and a diameter comprised between 1.8 and 3 mm.

The pins 21 may also have enlarged press-fit-type pin contact zones (not shown in FIG. 2, see FIG. 15A) in proximity to their distal end (remote from the pillar 8).

In one embodiment, the pins 21 may have two enlarged press-fit-type contact zones, as shown in FIG. 15B and discussed below.

Furthermore, the pins 21 may have stop zones, as shown in FIG. 15C and discussed below.

Alternatively, the pins 21 may have any base, for example square (with a side between 0.6 and 3 mm).

In FIG. 3, the pillar 8 has a flat end 8A, substantially level with the upper surface 2A of the housing 2.

Furthermore, the pin 21 is attached to the pillar 8 by soldering or gluing. In both cases bonding material (not shown) may be provided between the pin 21 and the pillar 8, for example soldering filler material or a conductive glue.

Alternatively, the pin 21 may be soldered without filler material, for example by ultrasonic welding.

Alternatively, the pin 21 may be press-fit to the pillar 8, as shown in FIG. 15B.

Figure 5:
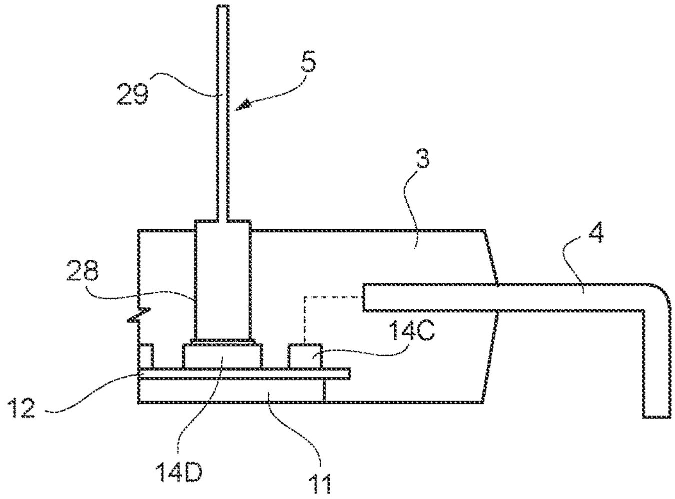
FIG. 5 is a cross-section of a part of the power module of FIG. 4.

In FIGS. 4 and 5, the power connectors 5 comprise a bigger area portion, referred to as pillar portion 28, similar to the pillar 8 of FIGS. 2, 3, and a narrower and longer portion, here called pin portion 29, formed monolithically.

In particular, as visible in FIG. 5, the pillar portion 28 extends inside the housing 2 (except for a slightly protruding section) and the pin portion 29 extends from the pillar portion 28, seamlessly, externally to the housing 2. In the embodiment shown, the pillar portion 28 is perpendicular to the upper surface 2A of the housing 2.

The pillar 8 and the pillar portion 28 may have structures which prevent undesired extraction thereof, such as protruding portions, recessing portions, undercuts, knurls, surface irregularities and the like.

Figure 6A:
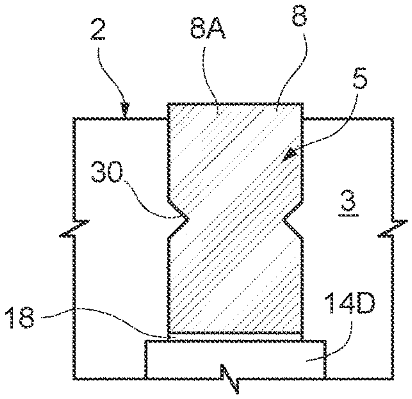
FIGS. 6A-6C, 7A-7C and 8 show cross-sections of variants of the pillar usable with the present power module.

For example, FIG. 6A shows a pillar 8 of cylindrical shape, having a peripheral groove 30 with annular shape and triangular section, intended to be filled with the resin of the housing 2 which blocks it in position.

In the example shown, the groove 30 is formed at about half the height or at a midway point of the pillar 8, but it may be arranged at any height.

Furthermore, here it extends throughout the perimeter of the pillar 8, but may be interrupted.

Alternatively, the surface of the pillar 8 may form one or more protruding annular structures, blocking the pillar 8 inside the packaging mass 3 forming the housing 2.

Figure 6B:
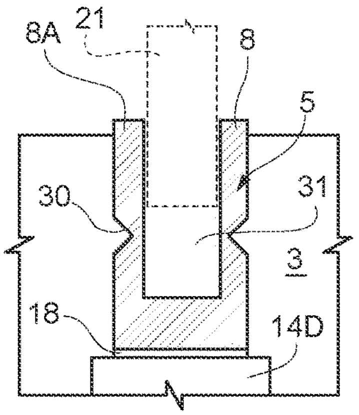

FIG. 6B shows a pillar 8 having the groove 30 and provided with an axial recess 31 extending from the end 8A towards the inside of the pillar 8. In this solution, as shown with dashed line, the pin 21 may be press-fit into the axial recess 31 and blocked, without the need to use glues and/or soldering.

Figure 6C:
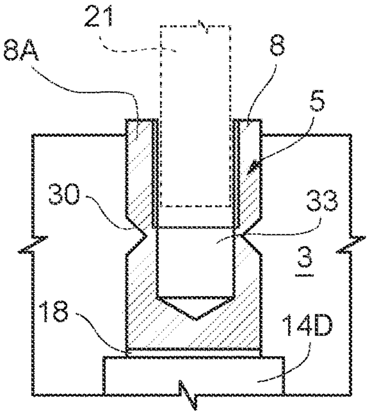

FIG. 6C shows a pillar 8 having the groove 30 and provided with a threaded hole 33 which extends axially from the end 8A towards the inside of the pillar 8. In this case, the pin 21 may be screwed to the pillar 8, also here without glues and/or soldering.

Figure 7A:
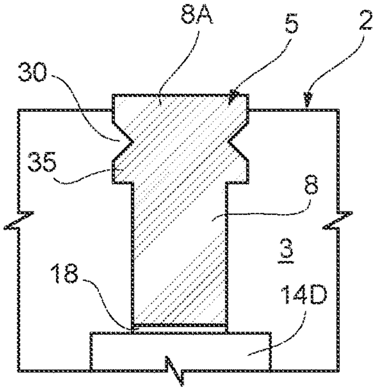

FIG. 7A shows a pillar 8 having an enlarged head 35 and the groove 30 is formed in the enlarged head 35 of the pillar 8 such that the groove 30 is closer to the end 8A of the pillar 87 than an opposite end of the pillar 8 that is coupled to the fourth connection region 14D by the bonding material 18.

Alternatively, the surface of the enlarged head 31 may form knurls or protruding and/or recessing structures which block it inside the housing 2.

Figure 7B:
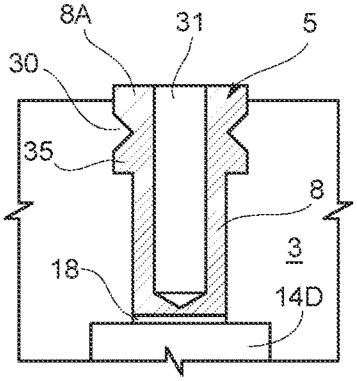

FIG. 7B shows a pillar 8 having the enlarged head 35 and the groove 30 as in FIG. 7A, and also an axial recess 31 similar to FIG. 6B. Also in this solution, therefore, the pin 21 may be press-fit into the axial recess 31.

Figure 7C:
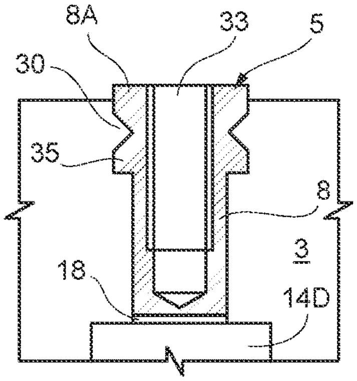

FIG. 7C shows a pillar 8 provided with the enlarged head 35 and the groove 30 as in FIG. 7A, and also with a threaded hole 33 as in FIG. 6C. In this solution, therefore, the pin 21 may be screwed to the pillar 8.

Figure 8:
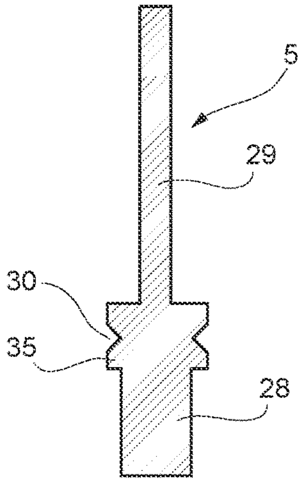

FIG. 8 shows a power connector 5 comprising the pillar portion 28 and the pin portion 29, that are monolithic, as in FIG. 5, wherein the pillar portion 28 also has the enlarged head 35 and the groove 30 as in FIG. 7A.

Alternatively, similarly to FIG. 6A, the power connector 5 of FIG. 8 may have only the groove 30, with no enlarged head 35, or other type of anti-extraction structures, as described above.

Figure 9:
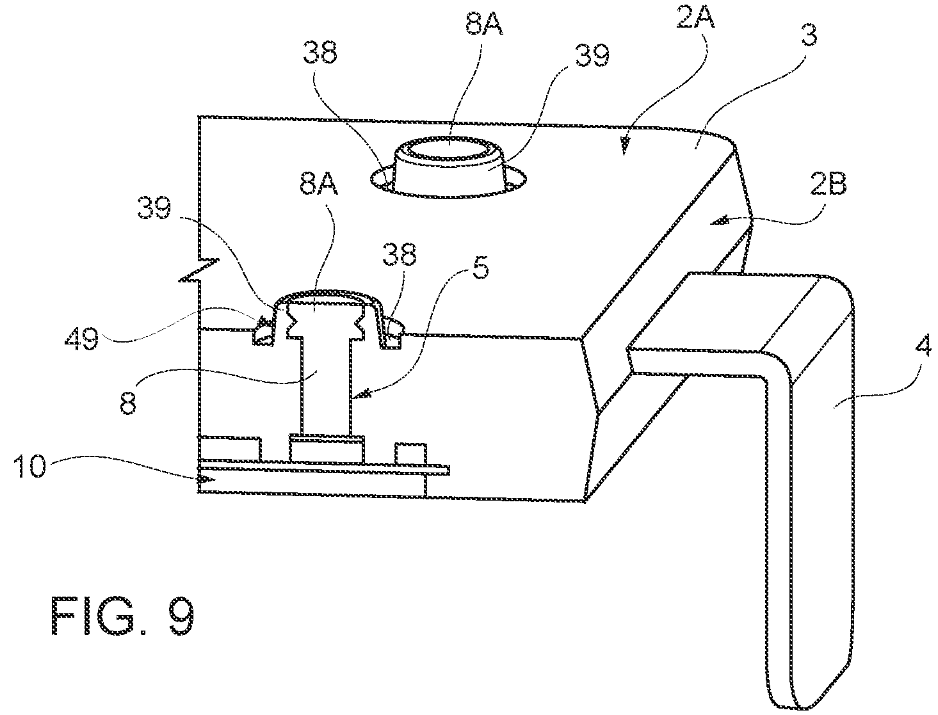
FIG. 9 is a sectional perspective view of a part of the present module, according to an embodiment.
Figure 10:
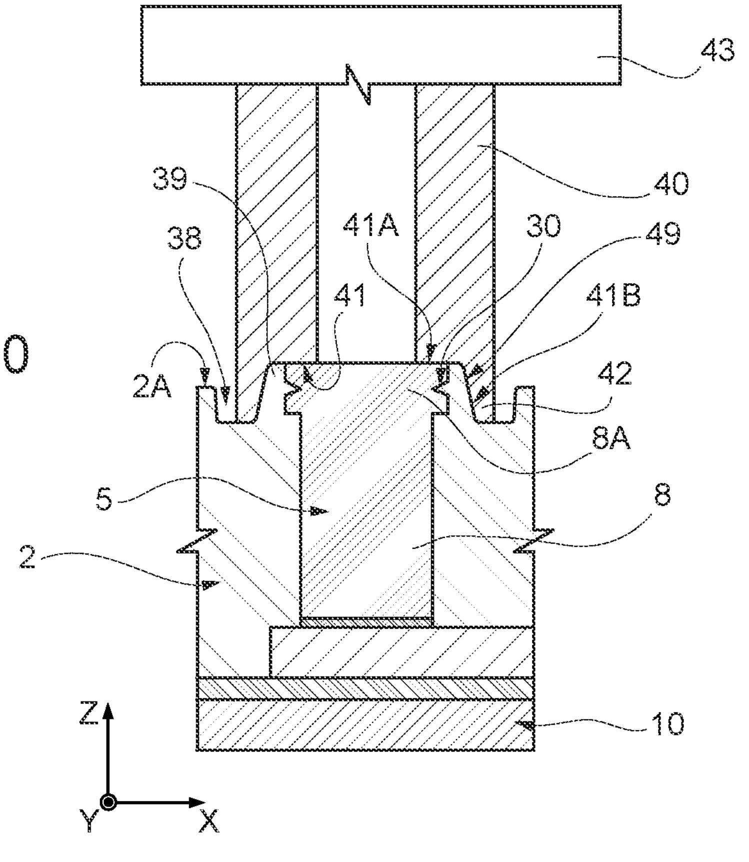
FIG. 10 is a cross-section of a detail of the power module of FIG. 9, during a housing molding step.

FIGS. 9 and 10 show a portion of a power module 1 having power connectors 5 of the type shown in FIG. 7A, with a flat end 8A, wherein the housing 2 has measures to compensate for any dimension differences with respect to design values, as well as misalignments and positioning inaccuracies due to manufacturing and/or assembling tolerances.

In detail, in detail FIGS. 9 and 10, the housing 2 has a peripheral slot 38 surrounding the end 8A of the pillar 8.

The peripheral slot 38 includes an inclined surface 49 that is at an angle with respect to the upper surface 2A. The inclined surface 49 extends past or into the upper surface 2A. In at least the embodiment as shown in FIG. 9, the inclined surface 49 terminates within the packaging mass 3.

In some embodiments, the inclined surface 49 extends past or into the upper surface 2A and terminates within the packaging mass before reaching a respective end of the pillar 8 that is opposite to the end 8A of the pillar 8.

The peripheral slot 38 here extends to a short distance from the end 8A, so that this end 8A is surrounded by an annular portion 39 of the material of the housing 2, wherein the annular portion 39 is in turn surrounded by the peripheral slot 38.

In FIG. 9, both the end 8A of the pillar 8 and the annular portion 39 protrude with respect to the upper surface 2A of the housing 2, due to the higher height of the pillar 8.

This configuration allows any height tolerances of the pillar 8 to be compensated, as explained hereinbelow with reference to FIG. 10.

In FIGS. 9 and 10, the pillar has the groove 30 near or in close proximity to the end 8A.

FIG. 10 shows a portion of the power module 1 during molding. In this step, the power module 1 is inserted into a mold (represented only schematically and indicated by 43) which comprises one or more ejectors 40, one for each power connector 5.

In the case shown, the ejector 40 has a non-flat head surface 41, with a bigger area than the end 8A of the pillar 8. In the illustrated example, the ejector 40 is hollow, but it may be solid; the following dimensional considerations are presented as if the ejector 40 were solid.

The head surface 41 of the ejector 40 has a central zone 41A that is plane and a peripheral zone 41B protruding with respect to the central zone 41A and forming a step 42. The central zone 41A (typically circular, in case of pillar 8 with a circular section) has a greater area than the end 8A of the pillar 8, so as to rest flat on this end 8A and protrude laterally thereto with the step 42 arranged to partially surround, at a distance, the end 8A of the pillar 8.

Consequently, when the material of the housing 2 (for example resin), in a fluid phase, is injected into the mold 43, the resin covers the support 10 and the electronic components 15A, 15B, surrounds each pillar 8 and also gets into the gap existing between the step 42 of the ejector 40 and the end 8A of the pillar 8, creating the peripheral slot 38 and the annular portion 39.

Assuming that the power module 1 is arranged, with respect to a Cartesian coordinate system XYZ, with the axis of the pillar 8 directed parallel to axis Z, this solution allows compensation of any height inaccuracies of the pillar 8 or of the underlying layers of the substrate 10 (inaccuracies along the axis Z as in FIG. 9) as well as any positioning inaccuracies of the pillar 8 or ejector 40 with respect to the axes X and Y.

In fact, the ejector 40 is rested on the end 8A of the pillar 8 with its central zone 41A, planar, and held in position by mechanical or pneumatic springs (not shown) capable of compensating for height errors of the end 8A of the pillar 8; the dimension of the central zone 41A allows compensation of any positioning errors along the axis X and/or the axis Y, as well as any small dimensional thickness tolerances, ensuring that the resin does not extend above the end 8A or form undesired peripheral burrs.

It should be noted that the “external” portion of the groove 38, not occupied by the ejector 40, is due to the shaping of the mold.

Figure 11:
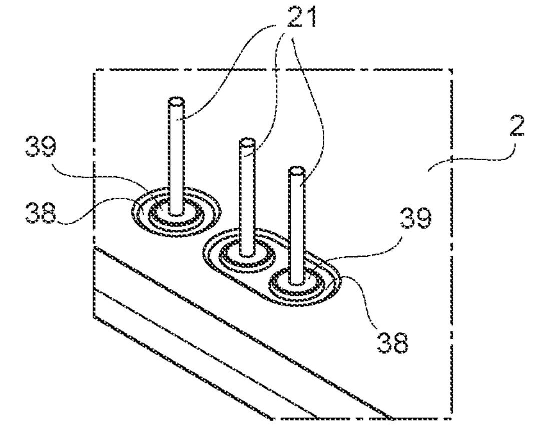
FIG. 11 is a perspective view of a portion of a power module, according to another embodiment.
Figure 12:
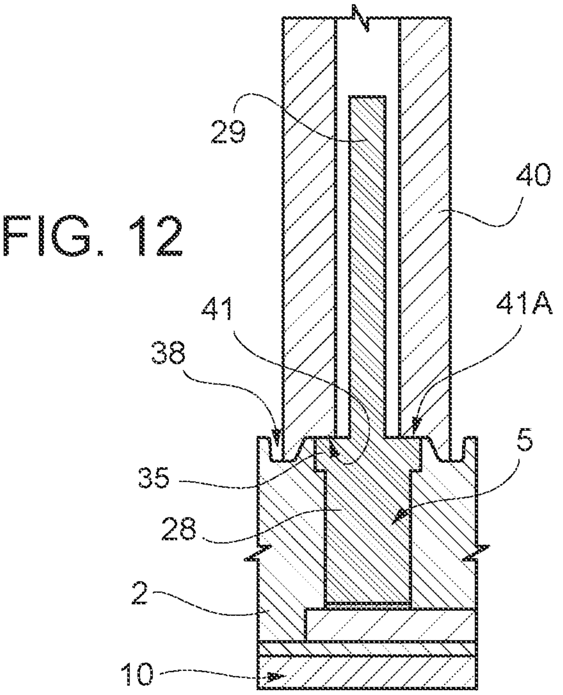
FIG. 12 is a cross-section of a detail of the power module of FIG. 11, during a housing molding step.

FIGS. 11 and 12 show the step of forming the housing 2 for a power connector 5 having an integral pin portion 29. In this case, the ejector 40 is again hollow, to house the pin portion 29 of the power connector 5. Here, the central zone 41A of the head surface 41 abuts against the shoulder formed by the enlarged head 35 of the pillar portion 28.

Figure 13:
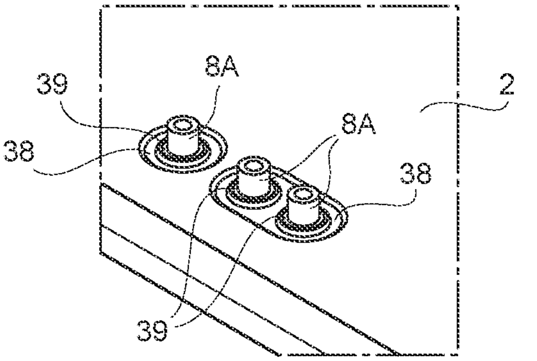
FIG. 13 is a perspective view of a portion of a power module, according to yet another embodiment.
Figure 14:
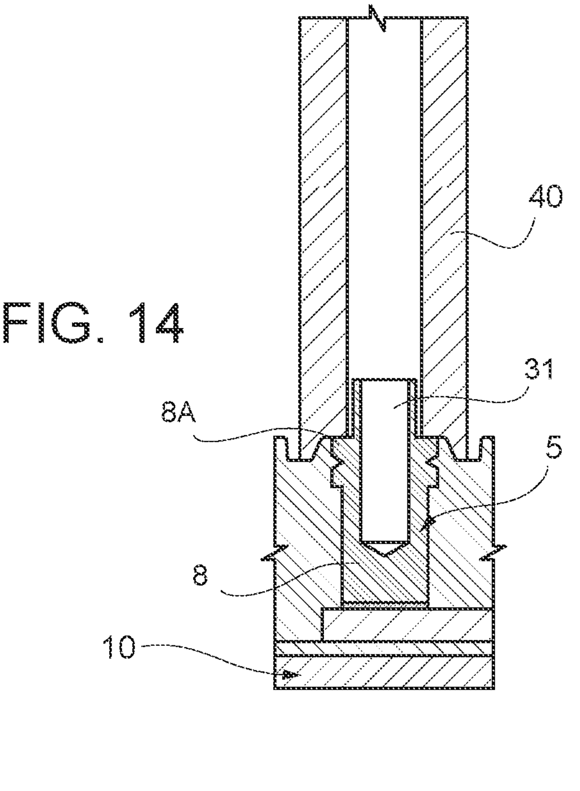
FIG. 14 is a cross-section of a detail of the power module of FIG. 13, during a housing molding step.

FIGS. 13 and 14 show the step of forming the housing 2 for a power connector 5 having a central hole, here the axial recess 31 of FIGS. 6B and 7B, but also valid in case of the threaded hole 33 of FIGS. 6C and 7C. In this case, the arrangement shown ensures that the resin does not enter the axial recess 31 or the threaded hole 33.

Figure 15A:
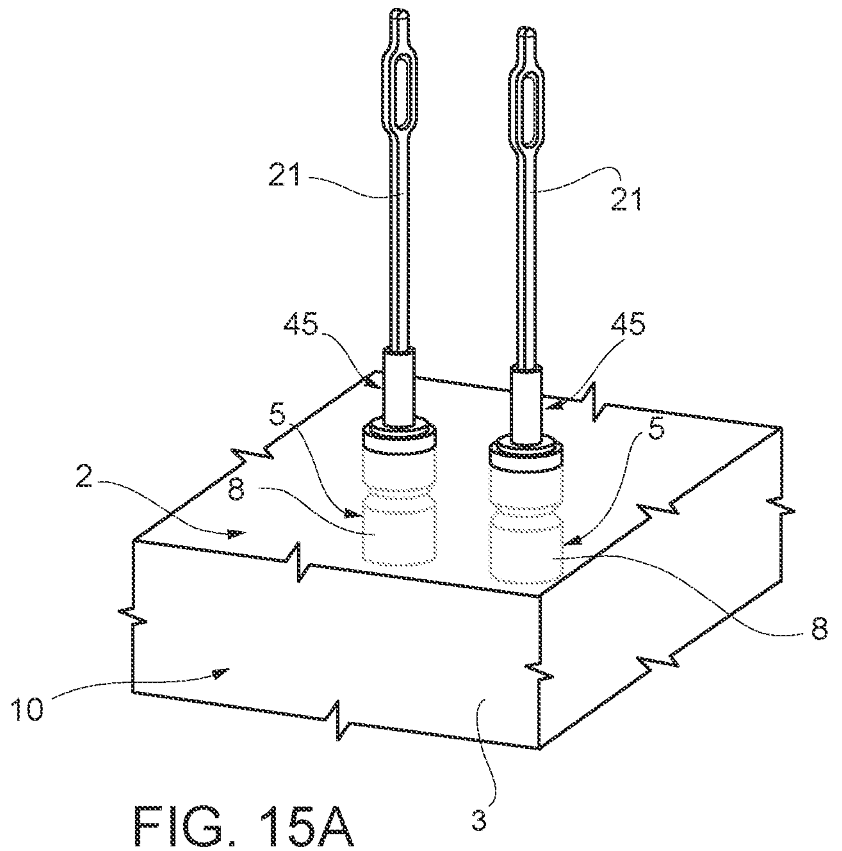
FIG. 15A shows the coupling between the present power module and external pins by pin holders.

FIG. 15A shows a solution wherein the pins 21 are attached to the pillars 8 through so-called pin holders 45 and have an end 21A having an enlarged zone (for example formed by axial bumps) so as to allow a press-fit connection with a connection support, such as a printed circuit board PCB.

Figure 16:
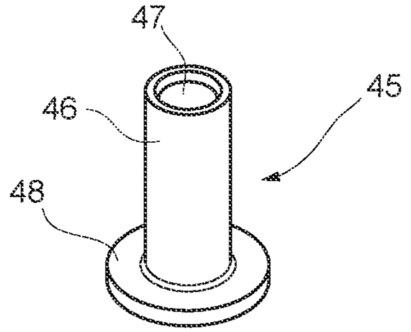
FIG. 16 is a perspective view of a pin holder usable with the power module of FIG. 15.
Figure 17:
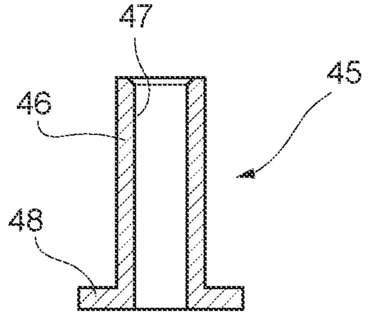
FIG. 17 is a cross-section of the pin holder of FIG. 16.

In detail, and as shown in FIGS. 16 and 17, each pin holder 45 is formed by a tubular body 46, here of cylindrical shape, having a through axial cavity 47 and provided, on one of its bases, with a flange 48.

Each pin holder 45 is attached to the end 8A (not visible in FIG. 15) of a respective pillar 8 through ultrasonic welding or laser welding, without filler material.

The pins 21 are then each interference-fit into a respective pin holder 45.

FIG. 15B shows a pin 21 having two enlarged ends 21A, 21B, for press-fit connection. For example, the pin 21 of FIG. 15B may be connected, with one of the two enlarged ends 21A, 21B, here a first enlarged end 21A, to the pillar 8 (as shown by the arrow) and with the other of the two enlarged ends 21A, 21B, for example a second enlarged end 21B, to a support such as a PCB.

FIG. 15C shows a pin 21 having an enlarged end 21A intended for press-fit into the axial recess 31 of the pillar 8 and a stop 25, next to the enlarged end 21A. The stop 25 has a greater width than the enlarged end 21A (and the axial recess 31) and has the purpose of preventing the pin from excessively penetrating into the axial recess 31 of the pillar 8.

FIG. 18 shows a power module 100 packaged according to the gel-potted technique.

In detail, the power module 100 comprises a housing 102 formed by two half-shells (first half-shell 101A, second half-shell 101B) of insulating material, for example plastic. The two-half shells define an outer shell and define a cavity 103 that is between the first-half shell 101A and the second half-shell 101B. The second half-shell 101B includes an internal surface 109 that faces the internal surface 105 of the first half-shell 101A.

A gel material 104 is contained inside the half-shells 101A, 101B and blocks and locks the support 10 and the electronic components (not visible in FIG. 18) in position. In the embodiment as shown in FIG. 18, the gel material 104 include a surface 104A that is spaced apart from an internal surface 105 of the first half-shell 101B such that a space 107 is present between the surface 104A of the gel material 104 and the internal surface 105 of the first half-shell 101B.

Here, the support 10 is attached to the first half-shell 101A and the power connector 5 extends through a hole 106 in the second half-shell 101B.

The power connector 5 shown in FIG. 18 is formed by the pillar 8 in the configuration shown in FIGS. 2 and 3; however, it may also be provided in any of the configurations of FIGS. 4-17 and, in particular, may comprise a pillar portion 28 and a pin portion 29, monolithic to each other, as in FIG. 5 or 8, or comprise a pin holder, similar to the component 45 of FIGS. 15-17.

Figure 19:
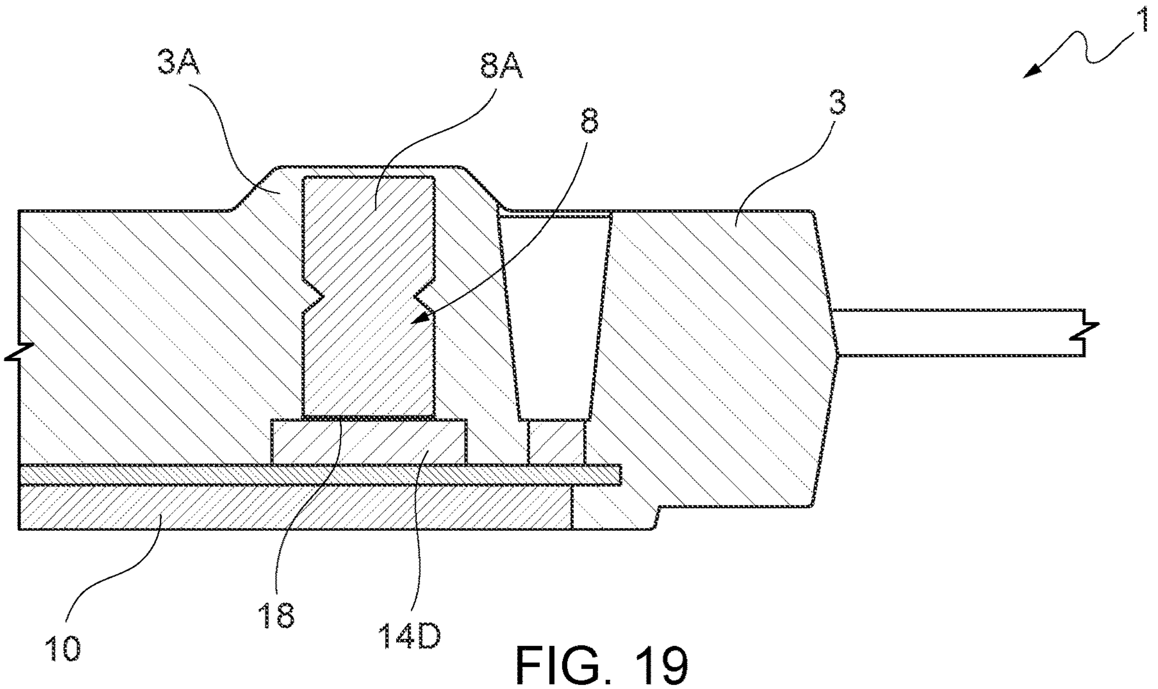
FIGS. 19 and 20 are cross-sections of a part of the present power module, according to another embodiment, in two subsequent manufacturing steps.
Figure 20:
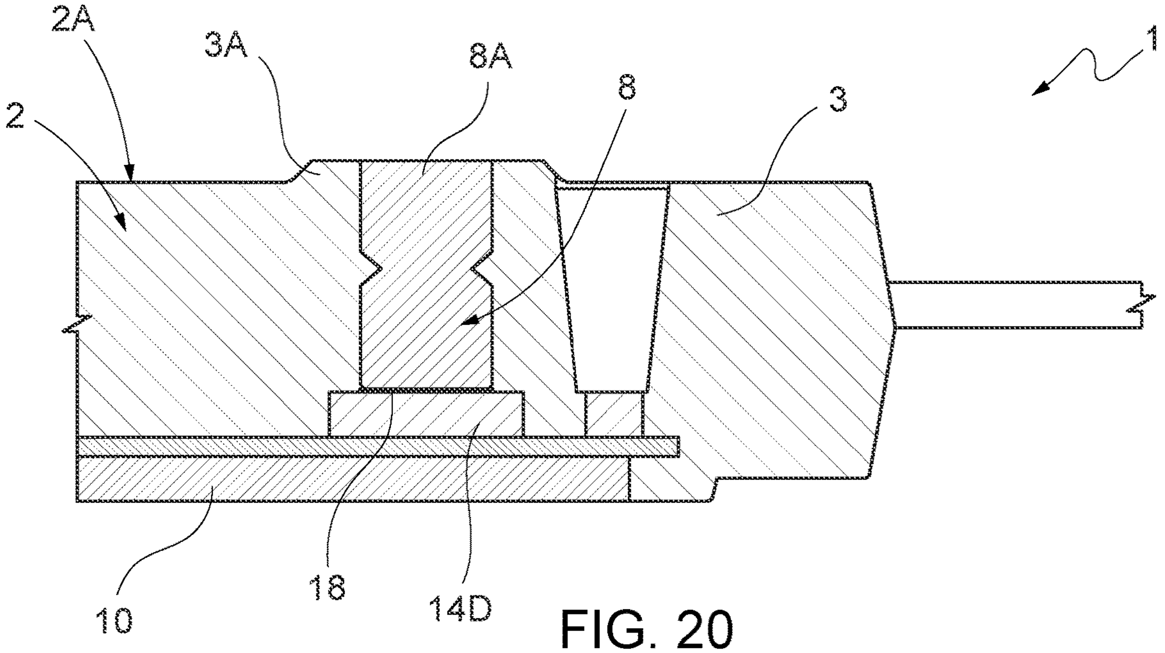

FIGS. 19 and 20 show two manufacturing steps of the power module 1, according to an embodiment; here, the pillar 8 of FIG. 6A is used.

In FIG. 19, the pillar 8 has already been soldered or glued to the fourth connection region 14D through bonding material 18, and the packaging mass 3 has already been molded.

Here, the mold (not shown) is such that the packaging mass 3 covers the end 8A of the pillar 8 and forms a protruding portion 3A.

The protruding portion 3A is then thinned to expose the pillar 8 and the pillar 8 is shortened, by a grinding operation.

Thereby, the end 8A of the pillar 8 is flush with the remaining part of protruding portion 3A of the packaging mass 3 (FIG. 20).

This process may be applied to pillars of different shape, for example the embodiments of FIGS. 2, 3, 7A.

Figure 21:
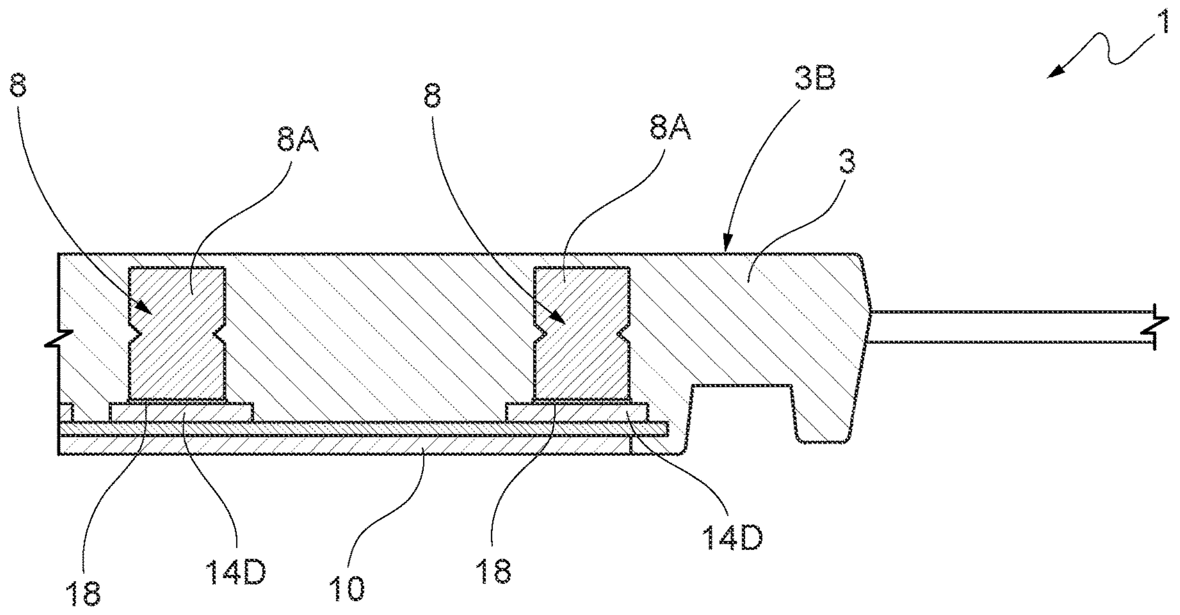
FIGS. 21 and 22 are cross-sections of a part of the present power module, according to a different embodiment, in two subsequent manufacturing steps.
Figure 22:
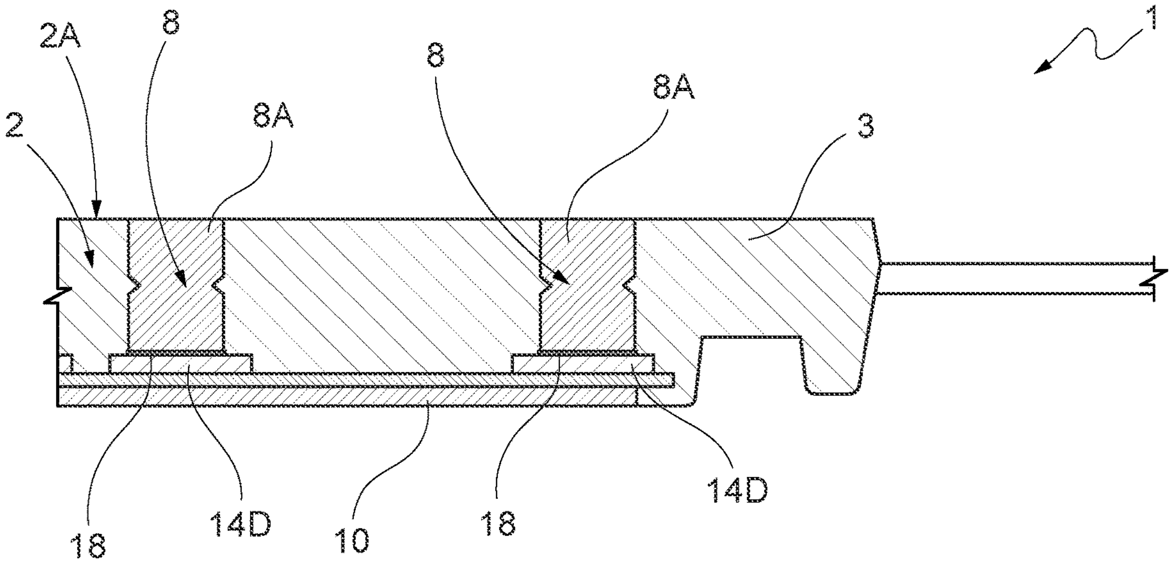

FIGS. 21 and 22 show two different manufacturing steps of the power module 1, according to a different embodiment; here, the pillar 8 of FIG. 6A is used.

In FIG. 21, the pillar 8 has already been soldered or glued to the fourth connection region 14D through bonding material 18, and the packaging mass 3 has already been molded.

In FIG. 21, the mold is such that the packaging mass 3 covers the end 8A of the pillar 8 without forming protruding portions. In other words, the packaging mass 3 has a flat upper surface 3B.

The packaging mass 3 is then ground at the flat upper surface 3B to expose the pillar 8. The upper portion of the pillar 8 and the upper portion of the packaging mass 3 may be ground, so that the end 8A of the pillar 8 is flush with the packaging mass 3 (FIG. 22).

Also this process may be applied to pillars of different shape, for example the embodiments of FIGS. 2, 3, 7A.

Figure 23:
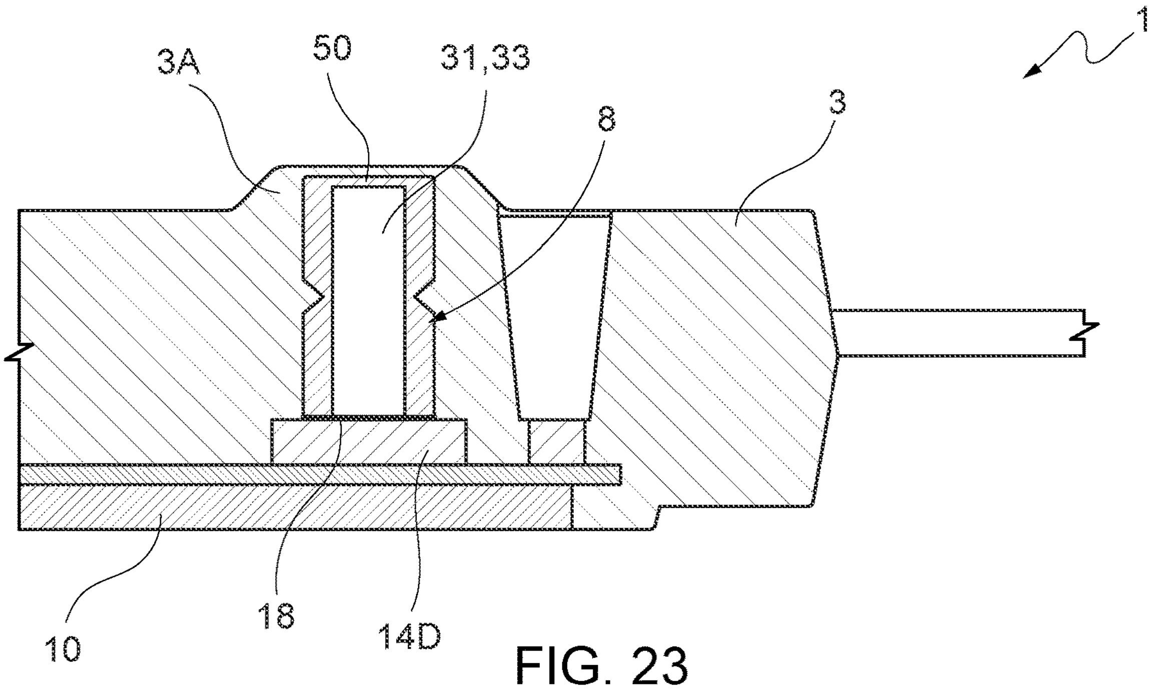
FIGS. 23 and 24 are cross-sections of a part of the present power module, according to another embodiment, in two subsequent manufacturing steps.
Figure 24:
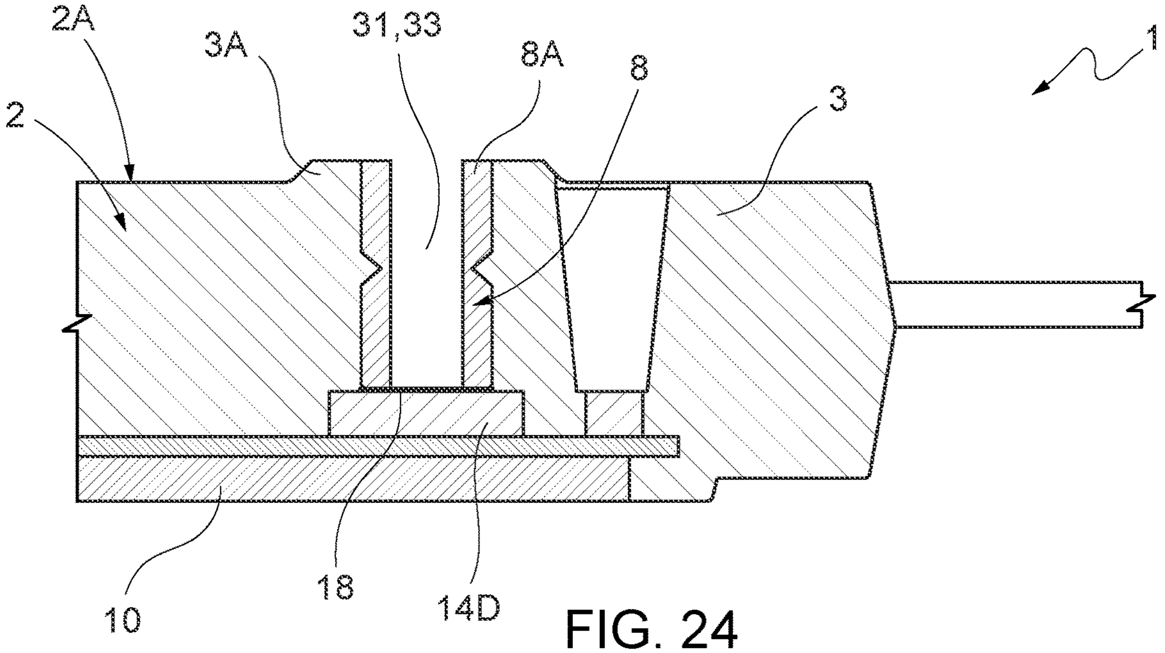

FIGS. 23 and 24 show two different manufacturing steps of power module 1, according to an another embodiment; here, holed pillars, such as pillars 8 of FIGS. 6B, 6C, 7B, 7C, 15B, are used.

In FIG. 23, the pillar 8 is soldered or glued to the fourth connection region 14D turned upside down, so that the axial recess 31 or threaded hole 33 faces the substrate 10 and a closed base 50 of the axial recess 31 or threaded hole 33 is arranged far from the substrate 10. Bonding material 18 is utilized.

In FIG. 23, the packaging mass 3 has already been molded and covers the closed base 50 of the pillar 8. As in the embodiment of FIGS. 19-20, the mold (not shown) is such that the packaging mass 3 completely covers the pillar 8. In particular, here, the packaging mass 3 covers the closed base 50 of the pillar 8 and forms the protruding portion 3A.

Here, the packaging mass 3 and the pillar 8 are ground until completely removing the closed base 50 and form the end 8A of the pillar 8. Thereby, FIG. 24, the axial recess 31 or threaded hole 33 is open to the outside and the end 8A of the pillar 8 is flush with the packaging mass 3.

Thereby, no resin or molding material may enter the axial recess 31 or threaded hole 33 during molding.

In the alternative to the embodiment of FIGS. 23, 24, analogously to FIGS. 21, 22, the packaging mass 3 may have a flat upper surface and no protruding portions are provided.

The described power module and its assembling method have numerous advantages.

In particular, exploiting the upper surface 2A of the housing 2, 102 for signal/power electrical connection of the electric components allows the external surface of the housing to be to efficiently exploited, by simplifying the complexity of the connections at the substrate 10 level, reducing the parasitic inductances and the dimensions of the power module, while allowing the critical distances and the desired creepage to be maintained based on expected working voltages.

The solution is easily adaptable to pins of different type and to the desired bonding type (press-fit, soldering/welding).

The power connectors 5 are inexpensive and the assembling operations are simple, so that the power module 1, 100 has costs comparable with the known solutions.

Finally, it is clear that modifications and variations may be made to the power module and to the assembling method described and illustrated herein without thereby departing from the scope of the present disclosure, as defined in the attached claims.

For example, the different embodiments described may be combined to provide further solutions.

Furthermore, if allowed by the electronic components, the power connector 5 may be attached directly to contact pads of the devices internal to the power module.

In the embodiments of FIGS. 19-24, thinning of the packaging mass 3 and shortening of the pillar 8 may be done by any other technique allowing removal of material, for example milling.

Thinning of the packaging mass 3 may stop at the pillar 8, without shortening the latter.

A power module (1; 100) may be summarized as including a housing (2; 102) having a main surface (2A) and lateral surfaces (2C); a carrying substrate (10), inside the housing, the carrying substrate forming a plurality of connection regions (14A-14D) of conductive material; an electronic component (15A, 15B), inside the housing, attached to a first connection region (14A, 14B) of the plurality of connection regions (14A-14D); and an electrical connector (5), coupled to the electronic component (15A, 15B) or to a second connection region (14C) of the plurality of connection regions, the electrical connector (5) extending towards the main surface (2A) of the housing (2; 102), transversely thereto, and being accessible from the outside of the housing.

The electrical connector (5) may include a pillar element (8; 28) having one end (8A) facing the main surface (2A) of the housing.

The pillar element (8; 28) may have a solid cylindrical shape.

The electrical connector (5) may further include a rod-shaped element (21) soldered to the end (8A) of the pillar element (8) and extending from the main surface (2A) of the housing (2; 102) to the outside of the housing, in prosecution of the pillar element (8).

The electrical connector (5) may further include a pin holder (45) formed by an axially holed cylindrical body and provided with a flange end (48), the flange end being attached to the end (8A) of the pillar element (8) and extending from the main surface (2A) of the housing (2; 102) towards the outside thereof, in continuation of the pillar element (8).

The electrical connector (5) may further include a rod-shaped element (21) press-fit in the pin holder (45).

The pillar element (8) may have a cylindrical shape and include an axial hole (31).

The electrical connector (5) may further include a rod-shaped element (21) press-fit or screwed into the axial hole (31) and extending in prosecution of the pillar element (8).

The electrical connector (5) may further include a pin portion (29) monolithic with the pillar element (28), the pin portion (29) being rod-shaped and extending externally to the housing (2; 102) in prosecution of the pillar element (28).

The pillar element (8; 28) may have anti-extraction characteristics (30; 35), the anti-extraction characteristics including protruding and/or recessing structures (21A) and possibly stops (15).

The housing (2) may include a packaging mass (3) that is electrically insulating and forms the upper surface (2A) and the lateral surfaces (2C), wherein a recess (38) in the upper surface surrounds the end (8A) of the pillar element (8; 28).

The housing (102) may include a box housing an insulating gel (104) and may form a gel-potted package, wherein the box includes a hole (106) configured to allow the end (8A) of the pillar element (8) to pass through.

The electronic component (15A) may form a first electronic component and the housing (2; 102) may house a second electronic component (15B), the power module may further include electrical leads (4) extending from or on the lateral surfaces (3C) of the housing and electrically coupled to external connection regions (14C) formed by the carrying substrate (10) and electrically coupled to the first and/or the second electronic component (15A, 15B).

An assembling method for a power module, may be summarized as including forming a carrying substrate (10) having a plurality of connection regions (14A-14D) of conductive material; attaching an electronic component (15A, 15B) to a first connection region (14C) of the plurality of connection regions; attaching an electrical connector (5) to a second connection region (14D) of the plurality of connection regions or to the electronic component; and forming a housing (2; 102) having a main surface (2A) and lateral surfaces (2C) and enclosing the carrying substrate, the electronic component and the electrical connector so that the electrical connector extends up to the main surface of the housing and is accessible from the outside of the housing.

Forming a housing (2) may include molding packaging insulating material (3) with a mold (43) including an ejector (40) having a head surface (41), wherein the head surface (41) of the ejector has a central zone (41A) configured to abut against the electrical connector (5), and a peripheral zone (41B), of a greater area than the central zone (41A) and the electrical connector (5) and configured to be arranged laterally to the electrical connector (5).

The electrical connector (5) may comprise a pillar (9), wherein forming a housing (2) may comprise molding packaging insulating material (3) completely covering the pillar; and removing the packaging insulating material (3) from above the pillar, thereby the pillar has an exposed end flush with the main surface (2A) of the housing (2).

Removing the packaging insulating material may comprise grinding.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power module, comprising:

a housing made of a packaging mass having a main surface and lateral surfaces;

a carrying substrate, inside the housing, the carrying substrate having a plurality of connection regions of conductive material;

an electronic component inside the housing, the electronic component is attached to a first connection region of the plurality of connection regions; and an electrical connector coupled to at least one of the following of the electronic component and a second connection region of the plurality of connection regions, the electrical connector extends towards the main surface of the housing, the electrical connector is transverse to the main surface of the housing, the electrical connector is accessible from the outside of the housing, the electrical connector includes an enlarged head at an upper end that extends outwards from the main surface of the housing and a lower end that is opposite to the upper end, the electrical connector includes a groove that extends into the enlarged head of the electrical connector, and the groove is filled with the packaging mass to interlock the electrical connector within the packaging mass;

a recess extends into the main surface and extends around the enlarged head; and a protrusion of the packaging mass that extends outward from the main surface and extends around the enlarged head.

2. The power module according to claim 1, wherein:

the packaging mass is an electrically insulating material; and the electrical connector further includes a pillar element coupled to the enlarged head, and the pillar element being embedded in the packaging mass.

3. The power module according to claim 2, wherein the pillar element has a solid cylindrical shape.

4. The power module according to claim 3, wherein the electrical connector further comprises a rod-shaped element soldered to the enlarged head.

5. The power module according to claim 2, wherein the electrical connector further comprises a pin holder having an axially holed cylindrical body and provided with a flange end, the flange end being attached to the enlarged head and extending away from the main surface of the housing towards the outside thereof, in continuation of the enlarged head.

6. The power module according to claim 5, wherein the electrical connector further comprises a rod-shaped element press-fit in the pin holder.

7. The power module according to claim 2, wherein the pillar element has a cylindrical shape, and the electrical connector further includes an axial hole that extends through the enlarged head and into the pillar element.

8. The power module according to claim 7, wherein the electrical connector further comprises a rod-shaped element press-fit or screwed into the axial hole and extending in prosecution of the pillar element.

9. The power module according to claim 2, wherein the electrical connector further comprises a pin portion monolithic with the enlarged head, the pin portion being rod-shaped and extending externally to the housing in prosecution of the pillar element.

10. The power module according to claim 2, wherein the groove is closer to the a respective surface of the enlarged head exposed from the packaging mass than an opposite end of the pillar element coupled to the at least one of the following of the electronic component and the second connection region of the plurality of connection regions.

11. The power module according to claim 2, wherein a recess extends into the main surface and surrounds the enlarged head.

12. The power module according to claim 1, wherein the electronic component includes a first electronic component and the housing houses a second electronic component, the power module further comprising electrical leads extending from or on the lateral surfaces of the housing and electrically coupled to external connection regions of the carrying substrate and electrically coupled to the first or the second electronic component.

13. The power module of claim 1, further comprising electrical leads extending from or on the lateral surfaces of the housing and electrically coupled to external connection regions of the carrying substrate and electrically coupled to the first or the second electronic component.

14. The power module of claim 1, wherein the electrical connector further comprises a pin portion monolithic with the enlarged head, the pin portion being rod-shaped and extending externally to the housing in prosecution of the pillar element.

15. The power module of claim 1, wherein the electrical connector further comprises a pin holder having an axially holed cylindrical body and provided with a flange end, the flange end being attached to the enlarged head and extending away from the main surface of the housing towards the outside thereof, in continuation of the enlarged head.

16. The power module of claim 1, further comprising: at least one lead that extends from a respective lateral surface of the lateral surfaces of the housing made of the packaging mass.

17. A device, comprising:

a housing made of a packaging mass having a main surface and lateral surfaces;

a carrying substrate within packaging mass, the carrying substrate includes a plurality of connection regions of conductive material;

an electronic component inside the packaging mass, the electronic component is attached to a first connection region of the plurality of connection regions;

an electrical connector extends through the packaging mass and is coupled to the at least one of the following of the electronic component and a second connection region of the plurality of connection regions, the electrical connector extends from the second connection region to the main surface, the electrical connector is transverse to the main surface, the electrical connector includes an enlarged head having a first surface, the electrical connector is accessible from the main surface of the packaging mass, the electrical connector includes a groove that extends into the enlarged head of the electrical connector, and the groove is filled with the packaging mass to interlock the electrical connector within the packaging mass; and a lead that extends outward from a respective lateral surface of the lateral surfaces of the packaging mass, and the lead is electrically coupled to a third connection region of the plurality of connection regions;

a recess extends into the main surface and extends around the enlarged head; and a protrusion of the packaging mass that extends outward from the main surface and extends around the enlarged head, the protrusion including a second surface, and wherein the first surface of the enlarged head is flush with the second surface of the protrusion.

18. The device of claim 17, wherein the electrical connector includes a portion that is less wide than the enlarged head of the electrical connector that extends from the enlarged head to the second connection region of the plurality of connection regions.

19. A device, comprising:

a packaging mass having a first surface, a second surface opposite to the first surface, and lateral surfaces transverse to the first surface and the second surface;

a conductive layer in the packaging mass, the conductive layer having a third surface and a fourth surface opposite to the third surface, the third surface of the conductive layer is exposed at the second surface of the packaging mass;

an intermediate layer on the fourth surface of the conductive layer;

a plurality of connection regions on the intermediate layer;

a pillar coupled to a first connection region of the plurality of connection regions, the pillar extends from the first connection region to the first surface of the packaging mass, the pillar includes an end exposed from the packaging mass;

a protrusion of the packaging mass protrudes outward from the first surface of the packaging mass and is surrounded by a recess that extends into the first surface of the packaging mass, the protrusion includes a third surface that faces away from the first surface of the packaging mass, the protrusion and the recess extend around the end of the pillar exposed from the packaging mass; and a lead that is coupled to a second connection region of the plurality of connection regions, the lead extends outward from a first lateral surface of the lateral surfaces, and wherein the end of the pillar is exposed from the third surface of the protrusion of the packaging mass.

20. The device of claim 19, further comprising a groove that extends into a side of the pillar, the groove in the side of the pillar is filled with the packaging mass, and the groove is configured to retain the pillar within the packaging mass.

21. The device of claim 19, wherein:

the pillar further includes:

an enlarged head at the end of the pillar; and a groove that extends into the enlarged head;

the grooves is filled with the packaging mass to interlock the pillar within the packaging mass.

* * * * *